United States Patent
Derderian

(10) Patent No.: US 7,109,113 B2
(45) Date of Patent: Sep. 19, 2006

(54) SOLID SOURCE PRECURSOR DELIVERY SYSTEM

(75) Inventor: Garo J. Derderian, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 135 days.

(21) Appl. No.: 10/769,433

(22) Filed: Jan. 30, 2004

(65) Prior Publication Data

US 2005/0166847 A1    Aug. 4, 2005

(51) Int. Cl.
*H01L 21/44* (2006.01)
*C23C 16/00* (2006.01)

(52) U.S. Cl. .................. 438/680; 118/726; 118/715

(58) Field of Classification Search ............. 118/715, 118/726, 719, 723 VE; 438/680, FOR. 388, 438/FOR. 393, 681; 257/E21.09, E21.091, 257/E21.269
See application file for complete search history.

(56) References Cited

U.S. PATENT DOCUMENTS 4,695,319 A * 9/1987 Miura et al. .................. 75/588
5,691,009 A * 11/1997 Sandhu ....................... 427/534
5,879,459 A * 3/1999 Gadgil et al. ................ 118/715
6,251,759 B1 * 6/2001 Guo et al. ................... 438/584
6,313,035 B1   11/2001 Sandhu et al. .............. 438/681

OTHER PUBLICATIONS

Lee et. al, Mass Production Worthy HfO2-Al2O3 Laminate Capacitor Technology using Hf Liquid Precursor for Sub-100 nm DRAMs, Dec. 2002,IEEE Conference, pp. 221-224.*

* cited by examiner

*Primary Examiner*—Matthew Smith
*Assistant Examiner*—Quovaunda Jefferson
(74) *Attorney, Agent, or Firm*—David J. Paul

(57) ABSTRACT

A solid source precursor material is delivered to a deposition chamber in vaporized form by utilizing a solid source precursor delivery system having either single or multiple stations(s) having a collection/delivery reservoir that is an intermediate stage between a solid source reservoir and a processing deposition chamber. Each collection/delivery reservoir transitions between a collection phase of the solid precursor and the delivery stage of the vaporized precursor during the deposition of a film.

16 Claims, 3 Drawing Sheets

SOLID SOURCE PRECURSOR DELIVERY SYSTEM

FIELD OF THE INVENTION

This invention relates to semiconductor processing and in particular to the means and methods for solid source precursor delivery for semiconductor fabrication processes, such as chemical vapor deposition (CVD) and atomic layer deposition (ALD).

BACKGROUND OF THE INVENTION

Chemical vapor deposition (CVD) and atomic layer deposition (ALD) processes are used extensively throughout semiconductor manufacturing fabrication. A commonality between these two processes is the use of a gaseous deposition source that enters the processing chamber and then chemically reacts within the chamber to deposit a desired film on a substrate assembly, typically a silicon wafer.

Both CVD and ALD processing utilize precursor materials as a source to deposit the required film and these precursors may be in either gas, liquid or solid forms. Many techniques have been developed to successfully delivery a gas or liquid precursor to the processing chamber in a gaseous or vaporized form. The more difficult precursor to use efficiently in the CVD or ALD process is the solid material (or solid source chemical precursor). The solid source chemical precursor must be converted to a vapor and transported to the processing chamber while avoiding significant thermal decomposition during the vaporization and delivery stage, which are obstacles that have proven difficult to overcome. What is needed is a deposition processing system that provides the means and method to effectively deliver a solid source chemical precursor to a deposition chamber that effectively addresses the obstacles thereof.

SUMMARY OF THE INVENTION

An exemplary implementation of the present invention includes the means and method of delivering a solid source chemical precursor material to a deposition chamber utilizing a solid source precursor delivery system having a single station of a collection/delivery reservoir that is an intermediate stage between a solid source reservoir and a deposition chamber. The collection/delivery reservoir transitions between a collection phase of the solid precursor and the delivery stage of the vaporized precursor during the deposition of a film.

Another exemplary implementation of the present invention includes the means and method of delivering a solid source chemical precursor material to a deposition chamber utilizing a solid source precursor delivery system having multiple stations, each having a collection/delivery unit, the multiple stations are intermediate stages between a solid source reservoir and a deposition chamber. Each collection/delivery unit transitions between a collection phase of the solid precursor and the delivery stage of the vaporized precursor and cycles back and forth between the collection and delivery stage during the deposition of the film.

DETAILED DESCRIPTION OF THE INVENTION

Specific embodiments of the present invention provide the means and the methods to deliver a solid source precursor material to a process chamber for deposition of a material onto a substrate, such as a semiconductor wafer, for semiconductor fabrication processes, such as chemical vapor deposition (CVD) and atomic layer deposition (ALD).

Figure 1:
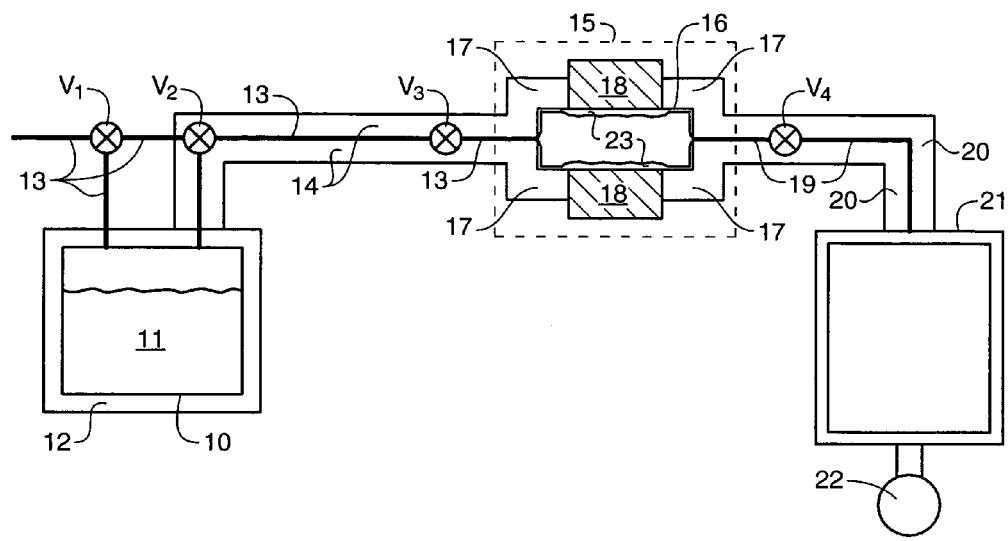
FIG. 1 depicts a semiconductor deposition processing apparatus utilizing a single station of a collection/delivery reservoir as an intermediate stage between a solid source reservoir and a deposition chamber, where the collection/delivery reservoir is in the solid precursor collection phase.

FIG. 1 depicts an embodiment of a solid source precursor delivery system of the present invention having a single station collection/delivery reservoir. A solid source chemical precursor material is held in a holding reservoir that is incased such that the holding reservoir is heated. Source delivery lines, also heated (i.e. heating piping) and interrupted by several valves, run from the holding reservoir to a collection/delivery reservoir. A processing chamber delivery line (i.e., heated piping), controlled by a valve, connects between the collection/delivery reservoir and the processing chamber. The collection/delivery reservoir allows for an efficient and controllable means to deliver a solid source chemical precursor material to a processing chamber in vapor form. An exhaust pump is connected to the processing chamber to expel waste from the chamber.

Referring again to FIG. 1, the operation of solid source precursor delivery system begins with the solid source chemical precursor reservoir 10 that contains a solid source precursor 11. The solid source precursor reservoir 11 is heated, by heating elements 12, to a temperature that is sufficiently high enough to cause the precursor to vaporize and yet not allow the vaporized precursor to decompose. The vaporized particles of the precursor are transported to the collection/delivery reservoir by way of the source delivery line 13 through valves V2 and V3. V1 allows for the addition of a desired gas or gases, such as an inert gas or a deposition gas or a combination thereof. The source delivery line 13 is heated, by heating elements 14, in the same manner as the solid source precursor reservoir 10 so that the precursor remains in the vaporized state (i.e., vaporized particles) upon entering the collection/delivery reservoir station 15. The uniqueness of the collection/delivery reservoir station 15 allows it to function both as a precursor collection reservoir and a precursor delivery reservoir. The collection/delivery reservoir station 15 is arranged such that each end of reservoir 16 is heated, by heating elements 17. By heating the ends (an entry port and an exit port) of the reservoir 16 the heated precursor is maintained in a vapor phase so that during the collection of the precursor, the ends of the collection/delivery reservoir 16 will not become clogged with precursor material.

The collection/delivery reservoir station 15 contains an inner chamber 18 that either heats or cools reservoir 16 depending on whether the reservoir 16 is collecting precursor material in solid form or dispensing (or delivering) vaporized precursor material. During the precursor collection phase, the inner chamber 18 cools the reservoir 16 to a temperature that is sufficient to cause the vaporized precursor entering the inner portion of the reservoir 16 controlled by the inner chamber 18 to revert to a solid material (or particles) by collecting the precursor 23 on the walls of the collection/delivery reservoir 16.

Figure 2:
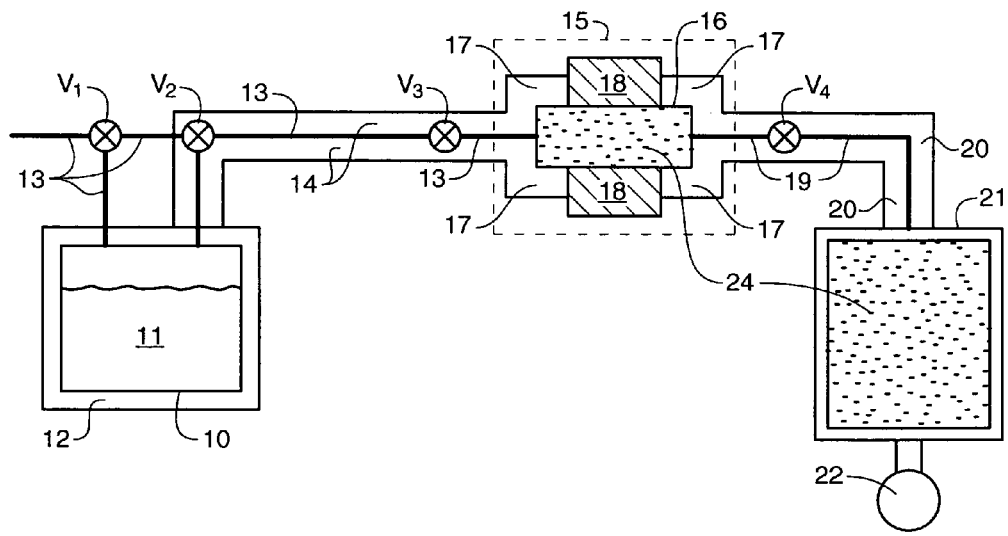
FIG. 2 depicts a semiconductor deposition processing apparatus utilizing a single station of collection/delivery reservoir as an intermediate stage between a solid source reservoir and a deposition chamber, where the collection/delivery reservoir is in the vaporized precursor delivery phase.

Referring now to FIG. 2, during the precursor delivery phase, the inner chamber 18 heats the inner portion of reservoir 16 to a temperature that again sufficiently vaporizes the precursor and yet avoids significant thermal decomposition of the precursor. The vaporized precursor 24 (or vaporized chemical deposition material) is sent to the processing chamber 21, such as a chemical vapor deposition chamber or an atomic layer deposition chamber, through the precursor delivery line 19 by way of valve V4. The precursor delivery line 19 is also heated, by heating elements 20 to a temperature that sufficiently maintains the precursor in a vaporized state and yet avoids significant thermal decomposition of the precursor. Excess precursor, deposition gases and excess reaction materials then exit the processing chamber 21 through the exhaust pump 22.

The timing between the (precursor) collection phase and the (precursor) delivery phase can be adjusted as needed. For example, a single collection phase and then a transition to the delivery phase may be sufficient to deposit the desired film on a substrate, such as a silicon wafer. In another example, the collection phase and delivery phase may be cycled back and forth until the desired film is deposited. In this example, first the solid precursor 23 would be collected in the collection/delivery reservoir 16 while the inner chamber 18 sufficiently cools the inner portion of the reservoir 16, then the collection/delivery reservoir station 15 would cycle to the delivery phase as the inner chamber 18 heats the inner portion of the reservoir 16 to produce the vaporized precursor 24 that is sent to the processing chamber 21. Then the process is cycled to collect more solid precursor, deliver more vaporized precursor and continues until the desired film thickness is obtained on the wafer.

Figure 3:
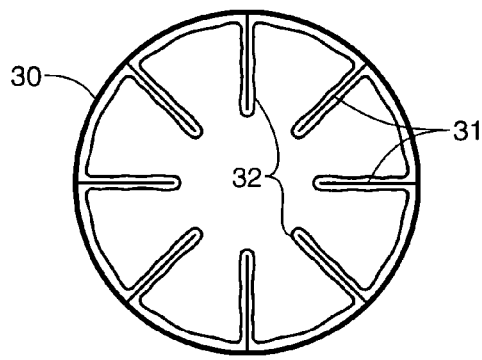
FIG. 3 is a cross-sectional view of a collection/delivery reservoir having a fin-shaped structure that allows for an increased amount of solid precursor material buildup during the collection phase.

FIG. 3 shows a cross-section of a fin-structured collection/delivery reservoir 30 that could be used to efficiently collect the solid precursor material 32. Buildup of the solid precursor material 32 develops on the inner walls of the collection/delivery reservoir 30 as well as on the fins 31 of the reservoir that extend inwardly from the reservoir walls. Any design of a collection/delivery reservoir may be used, but the preferred collection/delivery reservoir is one that provides an enlarged surface area in order to collect a sufficient amount of solid precursor material needed for deposition.

Figure 4:
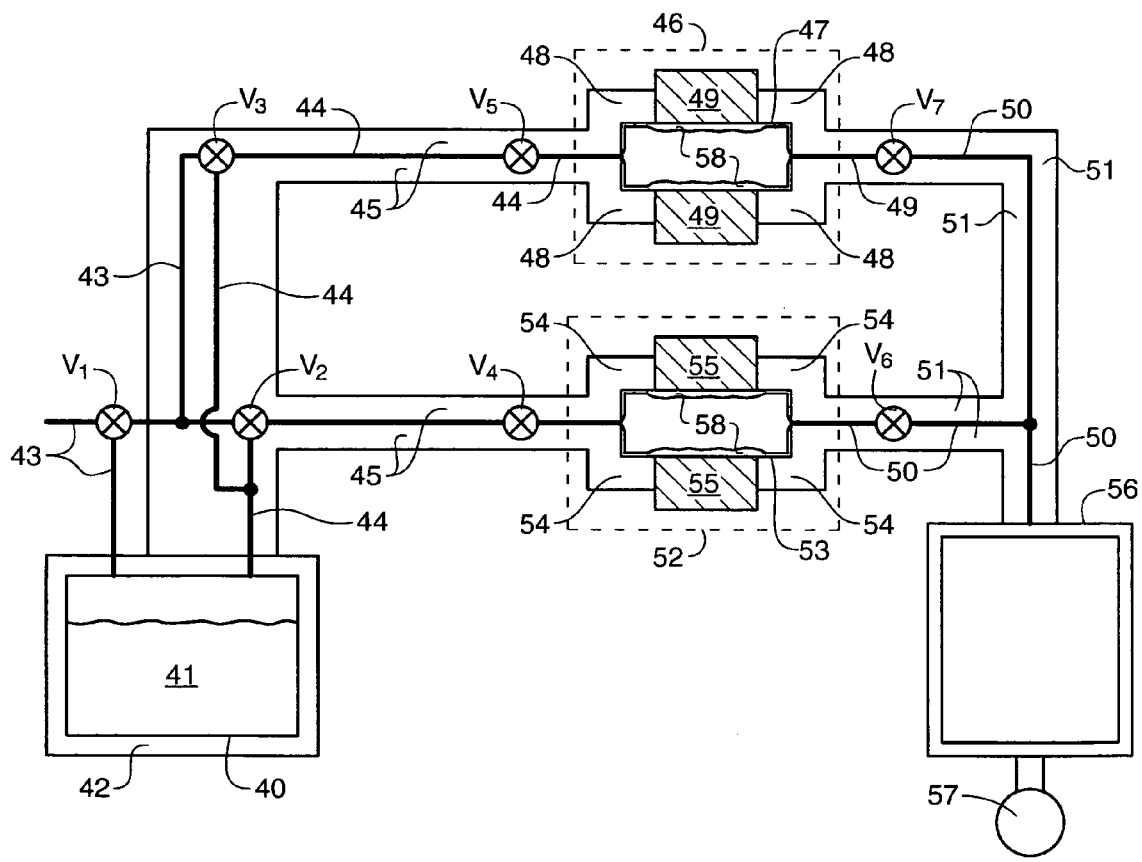
FIG. 4 depicts a semiconductor deposition processing apparatus utilizing multiple stations, each station having a collection/delivery reservoir (or unit), the multiple stations being intermediate stages between a solid source reservoir and a deposition chamber, where the multiple stations are in the solid precursor collection phase.

FIG. 4 depicts an embodiment of a solid source precursor delivery system of the present invention having multiple stations of collection/delivery reservoirs. As in the single station embodiment the solid source chemical precursor material is held in a holding reservoir that is incased such that the holding reservoir is heated. Multiple delivery lines, also heated (i.e., heated piping) and interrupted by several valves, run from the holding reservoir to multiple stations, each having a collection/delivery reservoir (or unit). It is to be noted that in FIG. 4 two separate stations are shown, but more may be added depending on the number of stations needed to provide an efficient precursor collection/delivery system for a given precursor. Multiple processing chamber delivery lines (i.e., heated piping) connect between each station and rejoin as a single delivery line to the processing chamber (this too could be altered to having multiple delivery lines entering the processing chamber). An exhaust pump is connected to the processing chamber to expel waste from the chamber.

Referring again to FIG. 4, the operation of solid source precursor delivery system begins with the solid source precursor reservoir 40 that contains a solid source chemical precursor 41. The solid source precursor reservoir 40 is heated, by heating elements 42 to a temperature that is sufficiently high enough to cause the precursor to vaporize and yet not allow the vaporized precursor (or particles) to decompose. The vaporized precursor is transported to each station 46 and 52 by way of the precursor delivery lines 44 through valves V2 and V4, and valves V3 and V5, respectively. Gas delivery line 43, by way of V1 allows for the addition of a desired gas or gases, such as an inert gas or a deposition gas or a combination thereof, to each station 46 and 52. The precursor delivery lines 44 are heated, by heating elements 45, in the same manner as the solid source precursor reservoir 40 so that the precursor remains in the vaporized state (i.e., vaporized particles) upon entering each collection/delivery reservoir. As before, each station containing the collection/delivery reservoir is unique in that each functions both as a precursor collection reservoir and a precursor delivery reservoir. Each collection/delivery reservoir (47 and 53) is arranged such that each end of the reservoir (an entry port and an exit port) is heated, by heating elements 48 and 54. By heating the ends of each reservoir 47 and 53, the heated precursor is maintained in a vapor phase so that during the collection of the precursor, the ends of the collection/delivery reservoir will not become clogged with precursor material.

Each collection/delivery reservoir station (46 and 52) contains an inner chamber (49 and 55) that either heats or cools the reservoir (47 and 53) depending on whether the reservoir is collecting precursor material in solid form or dispensing (or delivering) vaporized precursor material. During the precursor collection phase, the inner chamber cools the reservoir to a temperature that is sufficient to cause the vaporized precursor entering the inner portion of the reservoir, controlled by the inner chamber to revert to a solid material (or solid particles) by collecting the precursor (58) on the walls of the collection/delivery reservoir.

During the delivery phase, the inner chamber heats the inner portion of the reservoir to a temperature that again sufficiently vaporizes the precursor and yet avoids significant thermal decomposition of the precursor. The vaporized precursor (or vaporized chemical deposition material) is sent to the processing chamber 56, such as a chemical vapor deposition chamber or an atomic layer deposition chamber, through the delivery line 50 by way of valve V4. The delivery line 50 is also heated, by heating elements 51 to a temperature that sufficiently maintains the precursor in a vaporized state and yet avoids significant thermal decomposition of the precursor. Excess precursor, deposition gases and excess reaction materials then exit the processing chamber 56 through the exhaust pump 57.

Having at least two stations of collection/delivery reservoirs is advantageous as one station can be in the solid precursor collection phase, while the second station is in the vaporized precursor delivery phase. For example and referring to FIG. 4, the first and second stations 46 and 53 are in the collection phase, the operation of which is described above. At startup, the solid source precursor 41 is heated until it reaches the vaporized state and travels through the heated delivery lines 44, by way of V3 and V5 to enter the first station 46 and by way of V2 and V4 to enter the second station 52. The inner chambers 49 and 55 of the collection/delivery reservoirs 47 and 53 of both the first and second stations 46 and 52 are cooled to sufficiently collect the precursor material on the walls of each collection/delivery reservoir.

Figure 5:
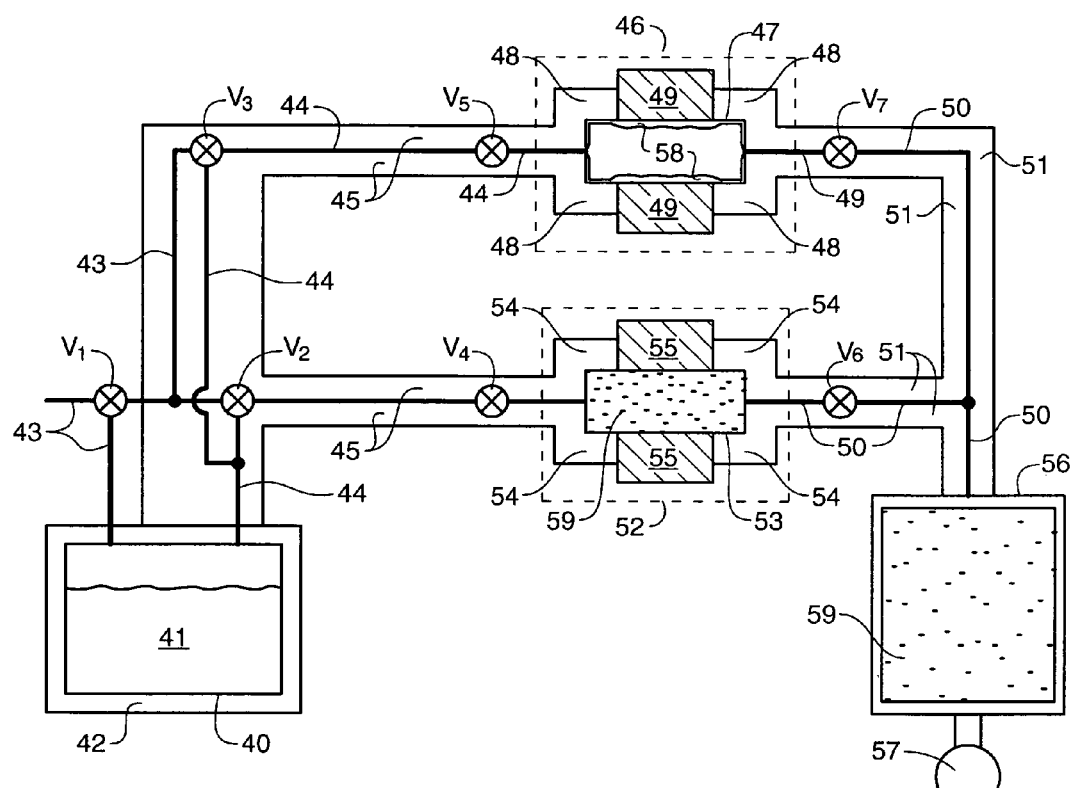
FIG. 5 depicts a semiconductor deposition processing apparatus utilizing multiple stations, each station having a collection/delivery reservoir (or unit), the multiple stations being intermediate stages between a solid source reservoir and a deposition chamber, where the multiple stations alternate between the solid precursor collection phase and the vaporized precursor delivery stage.

Referring now to FIG. 5, the second station 52 is transitioned to the delivery phase as the inner chamber 55 heats the inner portion of the reservoir 53 to a temperature to sufficiently vaporize the precursor material (without decomposing the precursor) and transfers the vaporized precursor 59 (a first volume of vaporized precursor) to the processing chamber 56 by way of V6. Once the second station (in the delivery phase) completes delivery of a second volume of vaporized precursor, the first station transitions to the precursor delivery phase and the second station transitions to the collection phase of the solid precursor. The deposition process continues as needed by cycling between the first and second stations until the desired film thickness is deposited. As disclosed previously in the collection phase, the solid precursor would be collected in the collection/delivery reservoir while the inner chamber sufficiently cools the inner portion of the reservoir. The vaporized precursor delivery phase is accomplished with the inner chamber heating the inner portion of the reservoir to produce the vaporized precursor that is sent to the processing chamber. When either station is in the delivery phase, the pressure of the collection/delivery reservoir can be monitored to determine when sufficient vaporization of the precursor has been reached. The process is then cycled to collect more solid precursor and deliver more vaporized precursor as needed to meet the required thickness of the film being deposited.

A solid source precursor system utilizing either a single station collection/delivery reservoir or multiple stations of collection/delivery reservoirs could be used to deposit such films as tantalum nitride (TaN) or tantalum oxide (TaO$_5$) using the solid source precursor of tantalum fluoride (TaF$_5$) and adding the appropriate deposition gas, or films, such as hafnium nitride (HfN) or hafnium dioxide (HfO$_2$) can be deposited by using the solid source precursor of hafnium chloride (HfCl4) and adding the appropriate gas. Many other solid source precursors would be successfully delivered to the processing chamber using the system and technique of the present invention as one skilled in the art would need to determine the temperatures for each precursor that will maintain the precursor in the solid state, the vaporization state and thermal decomposition state, using technical information as readily found in technical publications as the CRC handbook or chemical company catalogues, such as STREM, ALDRICH, etc.

For example, when using the solid precursor source of pertakisdimethyl tantalum Ta(NMe$_2$)F$_5$, one will find that the solid-state temperature is less than approximately 90° C., the melting point is approximately 180° C. or greater. The thermal decomposition of Ta(NMe$_2$)F$_5$ is based on both temperature and time. Ta(NMe$_2$)F$_5$ will decompose 3% at a temperature greater than 90° C. when heated approximately 6 hour. It is preferred that the percentage of decomposition that can be tolerated stay around 1%, as some decomposition may occur after vaporization begins.

It is to be understood that, although the present invention has been described with reference to a preferred embodiment, various modifications, known to those skilled in the art, may be made to the disclosed equipment and process herein without departing from the invention as recited in the several claims appended hereto.

What is claimed is:

1. A solid source precursor delivery system for a semiconductor fabrication process comprising:
   a solid source precursor reservoir;
   a processing chamber; and
   a collection/delivery reservoir having an inner fin-shaped cross-section and an entry port and exit port, the collection/delivery reservoir containing both cooling and heating elements and connecting between the solid source precursor reservoir and the processing chamber with heated delivery piping, the processing chamber being externally separate from the collection/delivery reservoir.

2. The method of claim 1, wherein the processing chamber is a chemical vapor deposition chamber.

3. The method of claim 1, wherein the processing chamber is an atomic layer deposition chamber.

4. The system of claim 1, further comprising heating elements located around the entry port and the exit port such that the temperature of the entry port and the temperature of the exist port are separately controllable from the collection/delivery reservoir.

5. A solid source precursor delivery system for a semiconductor fabrication process comprising:
   a solid source precursor reservoir;
   a processing chamber; and
   multiple stations, each station having a collection/delivery reservoir with an inner fin-shaped cross-section and an entry port and exit port, each collection/delivery reservoir containing both cooling and heating elements and connecting between the solid source precursor reservoir and the processing chamber with heated delivery piping, the processing chamber being externally separate from the collection/delivery reservoir.

6. The method of claim 5, wherein the processing chamber is a chemical vapor deposition chamber.

7. The method of claim 5, wherein the processing chamber is an atomic layer deposition chamber.

8. The system of claim 5, further comprising heating elements located on each entry port and each exit port such that the temperature of each entry and the temperature of exist port are separately controllable from a respective collection/delivery reservoir.

9. A solid source precursor delivery system for a semiconductor fabrication process comprising:
   a solid source precursor reservoir;
   a processing chamber; and
   a collection/delivery reservoir having an inner fin-shaped cross-section and an entry port and exit port, the collection/delivery reservoir containing both cooling and heating elements and connecting between the solid source precursor reservoir and the processing chamber with heated delivery piping.

10. The method of claim 9, wherein the processing chamber is a chemical vapor deposition chamber.

11. The method of claim 9, wherein the processing chamber is an atomic layer deposition chamber.

12. The system of claim 9, further comprising heating elements located around the entry port and the exit port such that the temperature of the entry port and the temperature of the exist port are separately controllable from the collection/delivery reservoir.

13. A solid source precursor delivery system for a semiconductor fabrication process comprising:
   a solid source precursor reservoir;
   a processing chamber; and
   multiple stations, each station having a collection/delivery reservoir having an inner fin-shaped cross-section with an entry port and exit port, each collection/delivery reservoir containing both cooling and heating elements and connecting between the solid source precursor reservoir and the processing chamber with heated delivery piping.

14. The method of claim 13, wherein the processing chamber is a chemical vapor deposition chamber.

15. The method of claim 13, wherein the processing chamber is an atomic layer deposition chamber.

16. The system of claim 13, further comprising heating elements located on each entry port and each exit port such that the temperature of each entry and the temperature of exist port are separately controllable from a respective collection/delivery reservoir.

* * * * *